United States Patent [19]

Shamouilian et al.

[11] Patent Number: 4,940,508
[45] Date of Patent: Jul. 10, 1990

[54] APPARATUS AND METHOD FOR FORMING DIE SITES IN A HIGH DENSITY ELECTRICAL INTERCONNECTING STRUCTURE

[75] Inventors: Shamouil Shamouilian; Paul N. Ludwig, both of Santa Clara, Calif.

[73] Assignee: Digital Equipment Corporation, Maynard, Mass.

[21] Appl. No.: 371,211

[22] Filed: Jun. 26, 1989

[51] Int. Cl.$^5$ ............ B44C 1/22; B23K 26/00; B29C 37/00
[52] U.S. Cl. .................. 156/643; 156/644; 156/655; 156/668; 156/345; 219/121.68; 219/121.69; 219/121.85
[58] Field of Search ............ 156/643, 644, 654, 655, 156/668; 427/53.1; 219/121.61, 121.68, 121.69, 121.78, 121.85

[56] References Cited

U.S. PATENT DOCUMENTS

| | | | |
|---|---|---|---|
| 3,549,733 | 12/1970 | Caddell | 264/25 |
| 3,622,742 | 11/1971 | Cohen et al. | 219/121.85 |
| 3,632,205 | 1/1972 | Marcy | 355/53 |
| 3,742,182 | 6/1973 | Saunders | 264/25 X |
| 3,991,296 | 11/1976 | Kojima et al. | 219/121 |
| 4,046,985 | 9/1977 | Gates | 219/121 |
| 4,224,101 | 9/1980 | Tijburg et al. | 156/643 |
| 4,490,211 | 12/1984 | Chen et al. | 156/643 |
| 4,504,726 | 3/1985 | Hosaka et al. | 219/121 |
| 4,555,610 | 11/1985 | Polad et al. | 219/121 |
| 4,561,721 | 12/1985 | Keilmann et al. | 350/162 |
| 4,615,765 | 10/1986 | Levinson et al. | 156/643 |
| 4,622,058 | 11/1986 | Leary-Renick et al. | 65/105 |
| 4,687,539 | 8/1987 | Burns et al. | 156/626 |
| 4,745,258 | 5/1988 | Arima | 219/121 |
| 4,752,668 | 6/1988 | Rosenfield et al. | 219/121 |
| 4,761,534 | 8/1988 | Foukes | 219/121 |
| 4,764,485 | 8/1988 | Loughran et al. | 437/225 |
| 4,842,677 | 6/1989 | Wojnarowski et al. | 156/643 |

OTHER PUBLICATIONS

XMR Brochure.

Primary Examiner—William A. Powell
Attorney, Agent, or Firm—Flehr, Hohbach, Test, Albritton & Herbert

[57] ABSTRACT

The present invention is directed to a system for removing material from a structure. The system includes an excimer laser for removing material by ablative photodecomposition and means for increasing the energy density of the laser beam. The system further includes an aperture structure having a plurality of openings of different sizes and shapes. At least one of these openings may be selectively positioned in the laser beam. Additionally, the system includes a stage for supporting the structure wherein the stage is moveable in at least the x and y directions.

34 Claims, 6 Drawing Sheets

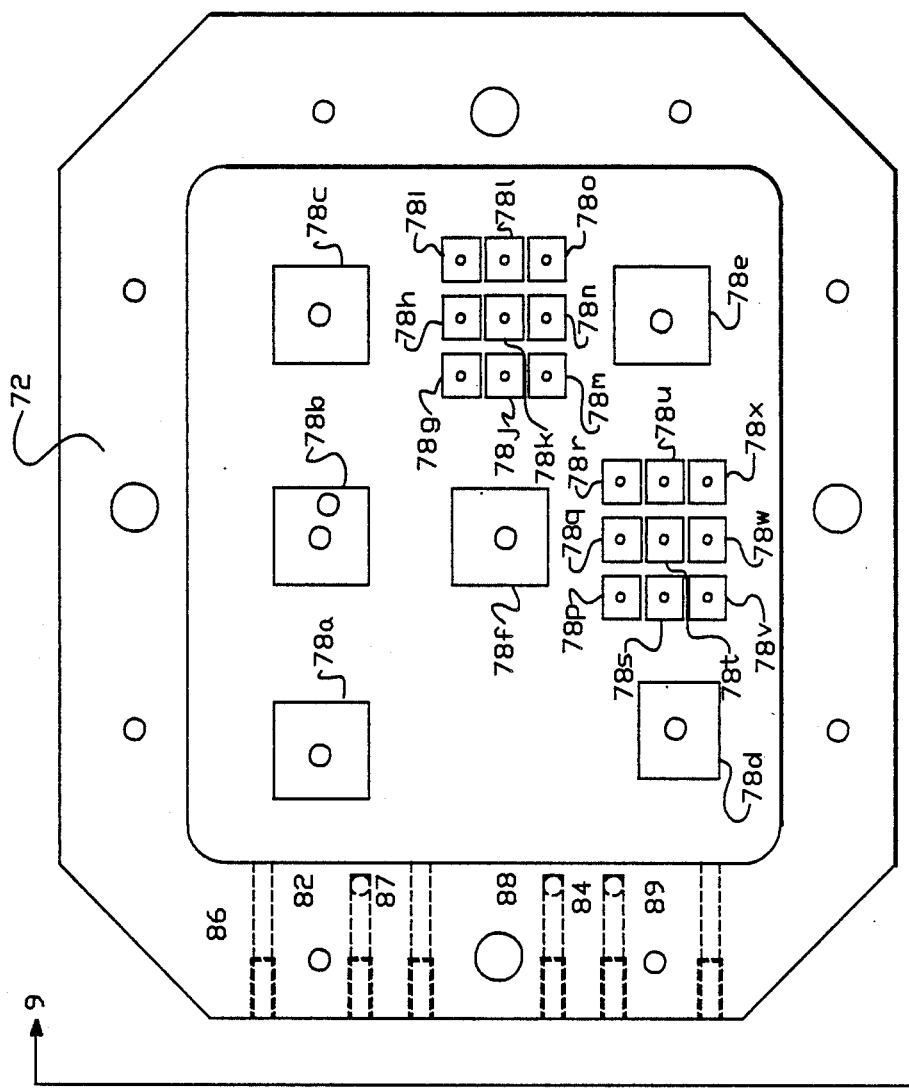
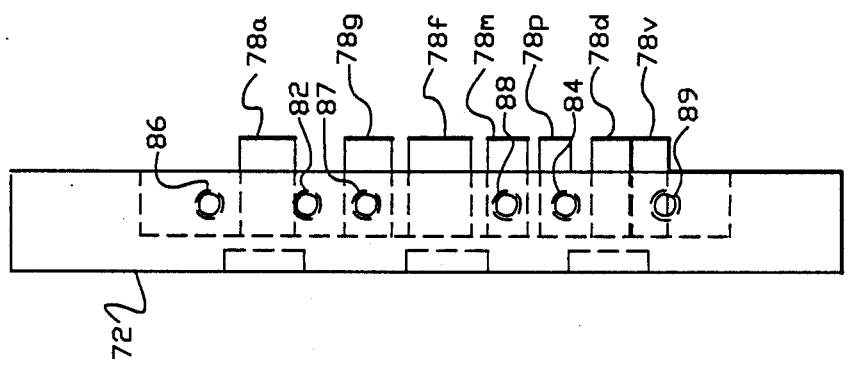

APPARATUS AND METHOD FOR FORMING DIE SITES IN A HIGH DENSITY ELECTRICAL INTERCONNECTING STRUCTURE

BACKGROUND OF THE INVENTION

The present invention relates generally to systems for removing material from a structure, and more particularly to an apparatus and method for forming die sites in a high density, electrical connecting structure.

High density electrical connecting structures are utilized, for example, to interconnect components of high performance digital computers. These structures comprise multiple layers consisting of conductors disposed in a polymer matrix. The structures have dielectric properties that allow high speed pulse propagation and high speed power supply. Discrete subassemblies comprising multiple layers may be joined together to form a high density electrical interconnection device. Such devices are sensitive to thermal and/or mechanical stresses, as the subassemblies may be placed in tension during fabrication. As such, the layered device may delaminate during the formation of die sites for the location of integrated circuit chips.

The present invention is directed to a system and method for forming die sites in high density electrical interconnection devices, with only minimal mechanical and thermal stresses induction. As such, product yields and reliability are improved. The present invention is particularly suitable for forming die sites in the high density signal carrier (HDSC) disclosed in U.S. patent application Ser. No. 055,794, entitled METHOD OF FORMING A MULTILEVEL INTERCONNECTION DEVICE, filed Jun. 1, 1987, Pat. No. 4,812,191, in the name of Ho et al., and assigned to the assignee of the present application, the entire disclosure of which is hereby incorporated by reference.

An object of the present invention is to provide an apparatus and method for forming die sites in a high density electrical interconnecting structure with minimal thermal and/or mechanical stress induction.

Another object of the present invention is to provide a method and apparatus for forming die sites in a high density, multilayer electrical connecting structure such that product reliability and yields are improved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the claims.

SUMMARY OF THE INVENTION

The present invention is directed to an apparatus for removing material from a structure. The apparatus includes an excimer laser for removing material by ablative photodecomposition and means for increasing the energy density of the laser beam. The apparatus further includes an aperture means having a plurality of openings of different sizes and shapes. Means are also provided for selectively positioning at least one of the openings in the laser beam. Additionally, the apparatus includes a stage for supporting the structure wherein the stage is moveable in at least the x and y directions.

The method of the present invention consists of actuating an excimer laser and directing a laser beam toward the aperture means. At least one opening of the aperture means is selectively positioned in the laser beam. The energy of the laser beam is increased, and the laser beam is directed toward the structure supported on the stage.

BRIEF DESCRIPTION OF THE DRAWINGS

The accompanying drawings, which are incorporated in and constitute a part of the specification, schematically illustrate a preferred embodiment of the invention and, together with the general description given above and the detailed description of the preferred embodiment given below, serve to explain the principles of the invention.

FIG. 7 schematically illustrates the back plate of the chuck.

FIG. 9 is a schematic view along line 9—9 of FIG. 7.

DESCRIPTION OF THE PREFERRED EMBODIMENT

Figure 1:
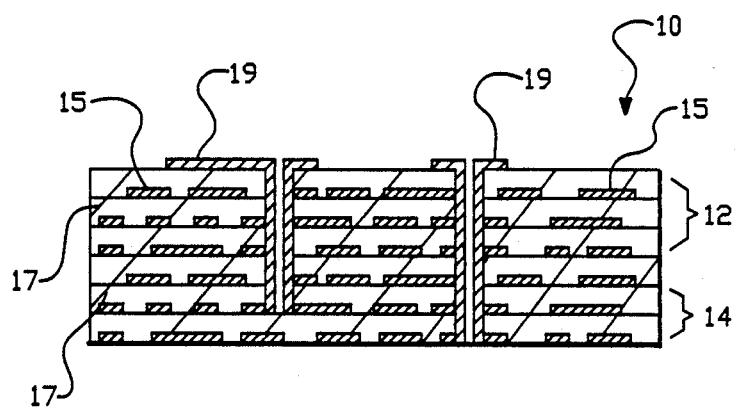
FIG. 1 is a schematic cross-sectional representation of a high density, electrical interconnection structure.

The present invention will be described in terms of the preferred embodiment. The preferred embodiment is an apparatus and method for forming die sites in a high density electrical interconnecting structure. Such a structure is shown in FIG. 1.

As illustrated, the high density electrical connecting device or structure 10 may comprise different subassemblies 12 and 14. One subassembly 12 may function as a signal core, while the other subassembly 14 functions as a power core. The two subassemblies 12, 14 may be joined to each other by an adhesive. The subassemblies may each comprise a number of layers, including conductors 15 disposed in a polymer matrix 17. The polymer matrix 17 may be a polyimide material, and conductors 15 may be copper. The device in its final form will also include a baseplate (not shown) comprised of a material having a coefficient of thermal expansion similar to a silicon chip. As is known in the art, the device 10 would also include appropriate interconnecting members 19 for interconnecting subassemblies 12 and 14. The device 10 in its completed form is a high density interconnecting structure capable of dealing with high speed pulse propagation such as that utilized in digital computers.

At this point, it is noted that the proportions of the various components shown in the drawings are not to scale and are merely illustrative of the general configuration of the device. Additionally, the power and signal cores 12 and 14 are shown as comprising three layers.

However, the device may include some greater number of layers. For instance, the HDSC referred to above may be made up of 30 layers.

After interconnecting members 19 have been formed in structure 10 but prior to adhering the structure to the above-noted baseplate, die sites must be formed in structure 10 for the location of integrated circuit chips. At this time, structure 10 may be mounted on a support means such as a metal ring and be in tension. As discussed, the present invention is particularly suited to forming die sites in a high density, electrical interconnecting device having multiple layers wherein the device is in tension.

As discussed, it is critical that the die sites be formed in structure 10 with minimum thermal and/or mechanical stress induction. If the device is subjected to excessive stresses, the device layers may delaminate, and then the structure will be ruined.

Figure 2:
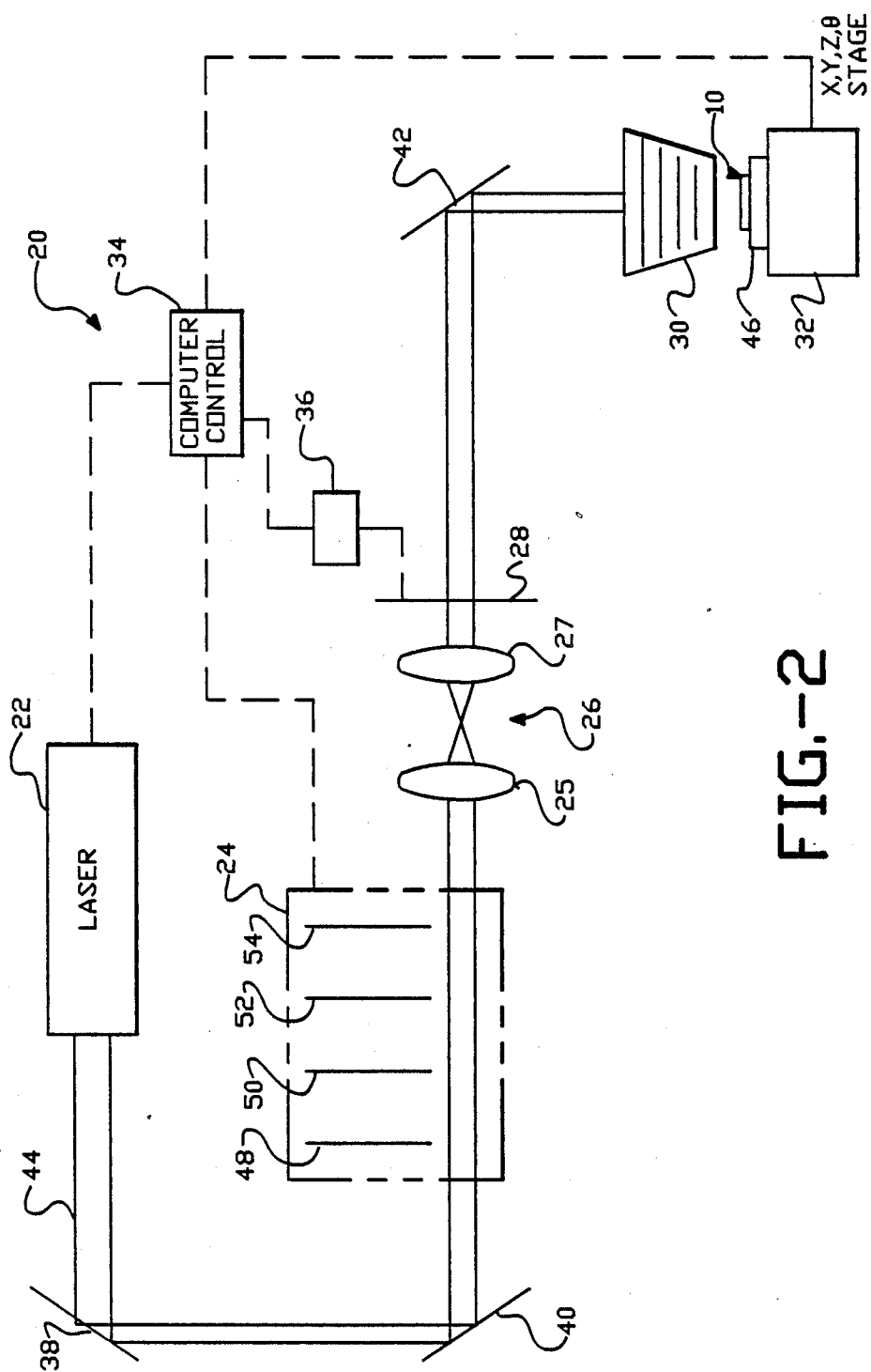
FIG. 2 is a schematic view illustrating the components of the apparatus of the present invention.

The system of the present invention provides a means for forming die sites with minimal thermal and/or mechanical stress induction. This system, referred to generally by reference numeral 20, is illustrated in FIG. 2. It includes a laser 22; an attenuator 24; a down collimator 26; an aperture 28; an objective lens 30; and an x, y, z, and θ stage 32. Stage 32, attenuator 24, and laser 22 are under the control of a personal computer (PC) 34 such as an IBM PC. A computer-controlled, stepper motor 36 also drives aperture 28. The system further includes a number of folding or bending mirrors 38, 40, and 42 for altering the direction of laser beam 44.

The laser source 22 is an excimer laser. In the preferred embodiment, it operates at a wavelength of 248 nanometers (nm), utilizing a krypton fluoride (KrF) gas lasing media. At this wavelength, the laser can be operated at a pulse rate of between 200 and 250 Hertz (Hz), at an energy level of 400–450 milli-joules (mJ) per pulse, and an energy density of 225–250 mJ per square centimeter (cm) per pulse. The laser has a power rating of between 100 and 120 watts. In the preferred embodiment, the laser is an EMG 203 MSC Excimer available from Lambda Physik of Acton, Mass.

As noted, the dielectric material used in device 10 may be polyimide. The laser, at wavelengths ranging from 190 to 308 nm, will cause ultraviolet (UV) photochemical degradation of the polyimide material. This UV photochemical degradation does not generate high thermal gradients in the material. Thus, through ablative photodecomposition, the material of structure 10 (including the adhesive joining subassemblies 12, 14) is cleanly removed with minimum stress induction. Die sites are formed in the areas from which the material is removed.

As shown in FIG. 2, beam 44 from excimer laser 22 is turned by folding mirrors 38 and 40 to pass through attenuator 24. The attenuator includes a shutter (not shown) to protect structure 10 from stray laser pulses or pulses used to calibrate laser power. The attenuator 24 can produce 16 different levels of energy from a constant laser source, depending on which one or a combination of attenuator plates 48, 50, 52, and 54 are positioned in laser beam 44. In the preferred method, none of the plates are located in the laser beam.

After passing through attenuator 24, the beam is next passed through down collimating optics 26. The collimator optics 26 include a pair of lenses 25 and 27. The focal distance of lenses 25 and 27 are 250 millimeters (mm) and −75 mm, respectively. Down collimator 26 reduces the cross-sectional dimension of the laser beam and thus increases its energy density. The laser beam emanating from the head of laser 22 has a rectangular profile approximately 2 cm high by 8 cm long. After passing through down collimator 26, the rectangular geometry of the beam is reduced to approximately 12.25 mm × 4 mm. The collimated beam has an energy density of between approximately 300 and 330 milli-joules/cm$^2$ per pulse.

Figure 3:
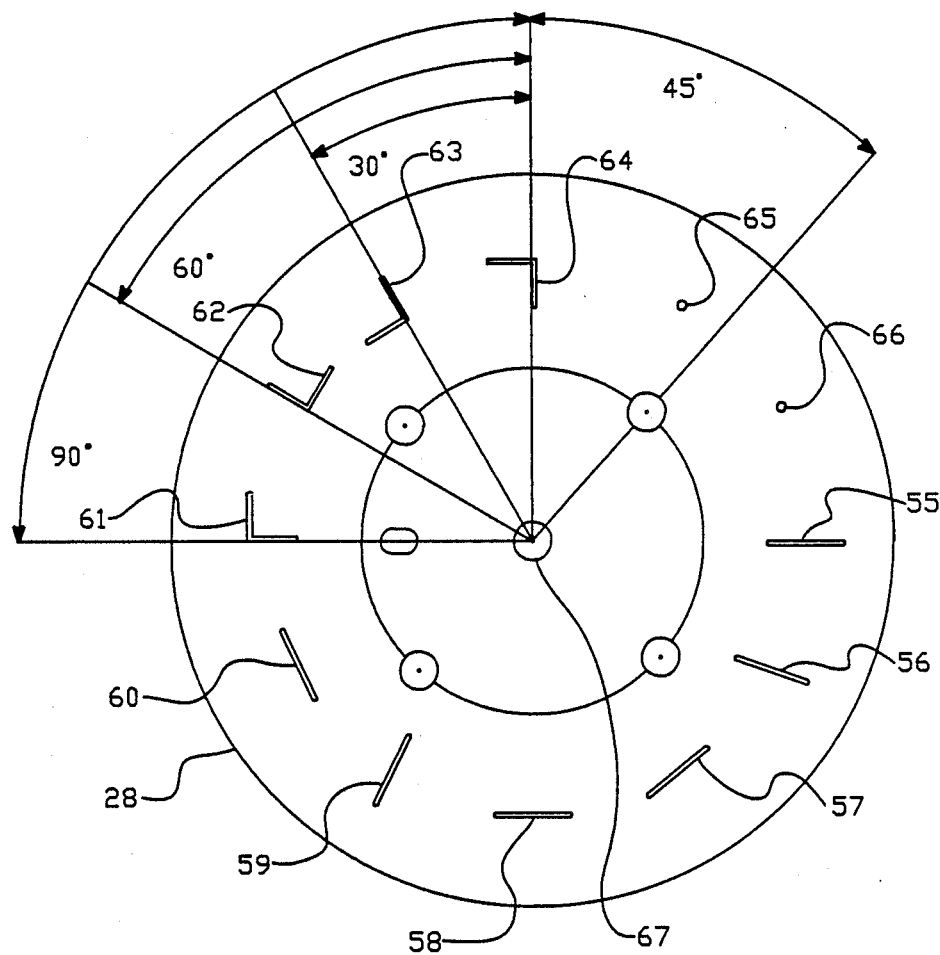
FIG. 3 is a schematic representation of the disk-shaped aperture utilized in the apparatus of the present invention.

The collimated beam is used to flood selected slits or openings in aperture 28. Aperture 28 is driven by motor 36 under the control of computer 34. In the preferred embodiment, the motor utilized is a Compumotor model M57-51-R1. As shown in FIG. 3, aperture 28 has a disk-like shape, and plurality of slits 55–66 are formed about the circumference of the disk. A drive shaft (not shown) from the motor is attached to the disk at its center 67. The relative positions of the slits about the disk are shown in FIG. 3, and the size and orientation of the slits are also provided by Table 1.

TABLE 1

Figure 4:
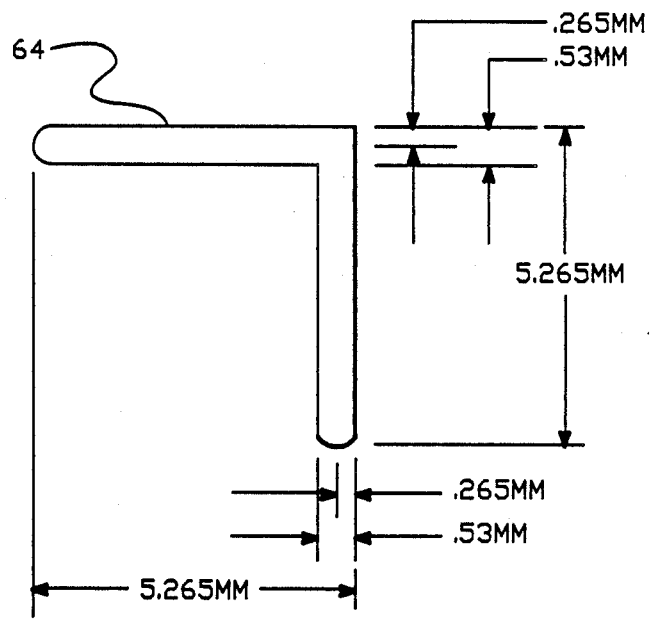
FIG. 4 is a schematic representation of an opening or slit formed in the aperture.

| Slit Reference No. | Size and Orientation (As related to the 3:00 position) |
|---|---|
| 65, 66 | .53 × .53 mm Square |
| 55, 56 | 8 × .53 mm Horizontal |
| 57, 58 | 10 × .54 mm Vertical |
| 59 | 6 × .53 mm Horizontal |
| 60 | 8 × .53 mm Vertical |
| 61–64 | See FIG. 4 |

(FIG. 4 illustrates dimensions for L-shaped slits 61–64.)

As discussed above, the collimated beam is utilized to flood a selected slit of laser disk aperture 28, depending upon which area of the part 10 is being operated on. For instance, the laser beam may pass through selected ones of the L-shaped slits 61–64 where a corner of a die site is being formed in part 10. Similarly, the laser beam will pass through slits 55 or 56 to make a horizontal cut, and slits 65 or 66 to make a square cut.

After passing through a selected slit in aperture 28, the beam is again folded by bending mirror 42 and directed to objective lens 30. The lens has a four power objective to demagnify the laser beam by a factor of four (−4.0x). The size of the laser beam spot on the work piece or part 10 is, therefore, determined by the size of the slit aperture through which the beam passes and the demagnification produced by lens 30. An increase in laser energy density is also produced by demagnifying the laser beam. The demagnified beam has an energy density of between about 3 and 4 milli-joules/cm$^2$ per pulse.

The lens 30 may or may not be color corrected. If the lens 30 is not color corrected, the laser beam (UV light) and light in the visible spectrum (white light) do not have the same focal plane. Thus, observation of the real time cutting process through, for example, a binocular microscope and a video monitor is not possible. A color corrected lens will permit such observation. However, a color corrected lens may be damaged by the laser beam at a wavelength of about 248 nm.

In the embodiment described herein, lens 30 is not color corrected, and its construction is illustrated in FIGS. 5A–5D. As shown, it comprises two lenses 31 and 33 disposed within a cylindrical housing 35. The overall length "1" of housing 35 is about 0.90 of an inch, and its diameter "d" about 1.00 inch. A cylindrical spacer 37 fits within housing 35 to hold lens 31 in place and to space it from lens 33. The width "w" of the spacer is approximately 0.321 of an inch. Lens 31 is thus positioned between and abuts spacer 37, and the shoulder-like projections 35a of housing 35.

A cylindrical retaining ring 39 is also located within the housing. As shown, lens 33 is positioned between and abuts spacer 37 and ring 39. The retaining ring 39 includes threads so that it can be screwed into the housing as illustrated. Opposed slots (not shown) are formed at the top and bottom of the ring for receiving an appropriately-designed wrench for removing the ring from the housing and thus disassembling the components of objective lens 30. The housing and retaining ring may be fabricated of an aluminum alloy material, and the spacer may be stainless steel.

Laser beam 44 enters objective lens 30 through lens 31. The laser beam 44, as noted, is then demagnified and focused at focal point F by lenses 31 and 33. The distances "a" and "b" between the focal plane and selected points on the housing may be about 28.2 mm and 45 mm, respectively. The normal aperture of objective lens 30 is 0.23 and its useful aperture is about 17.3 mm.

Figure 5A:
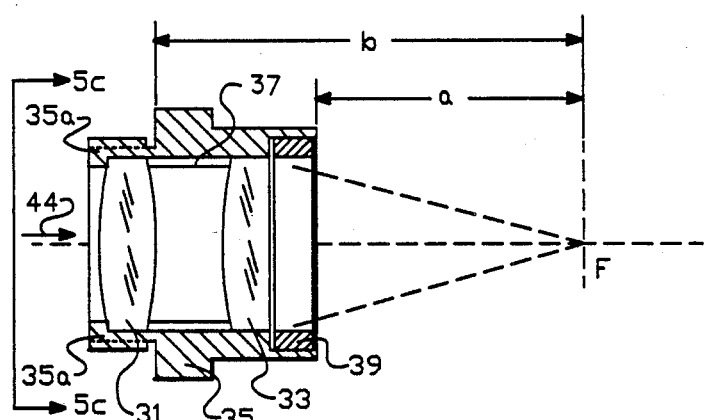
FIG. 5A is a schematic side view illustrating the objective lens of the apparatus of the present invention.
Figure 5B:
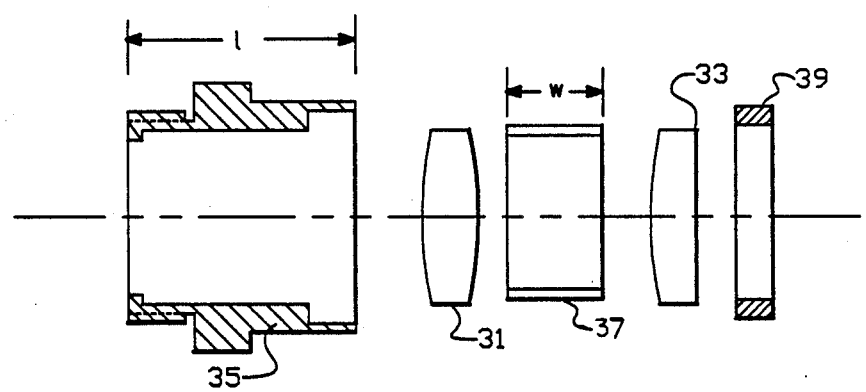
FIG. 5B is an exploded view of the objective lens of the apparatus of the present invention.
Figure 5C:
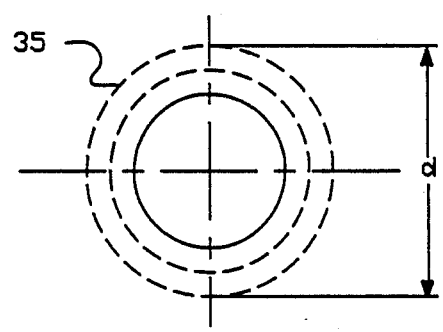
FIG. 5C is a view along lines 5C—5C of FIG. 5A.
Figure 5D:
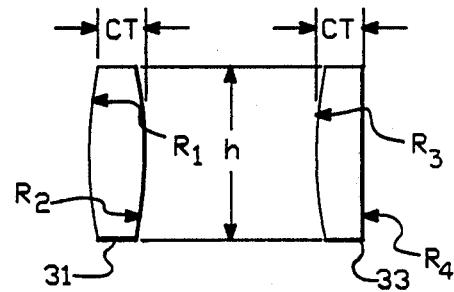
FIG. 5D is a schematic view illustrating the lenses utilized in the objective lens of the apparatus of the present invention.

Lenses 31 and 33 are also shown in FIG. 5D. The radiuses of curvature $R_1$ and $R_2$ of the convex surfaces ($C_x$) of lens 31 are each equal to approximately 67.64 mm. The radius of curvature $R_3$ of the convex surface of lens 33 is approximately 23.22 mm, and the radius of curvature $R_4$ of the concave surface of lens 33 is about 99.82 mm. The center thickness CT of each lens 31, 33 is about 5.0 mm ($\pm 0.1$), and the height "h" of each lens is about 18.00 mm ($\pm 0.00$–$0.02$). Lenses 31, 33 are both treated with a 248/308 nm broadband anti-reflective coating.

The radiuses of lenses 31, 33, their thicknesses, and the spacing between them within housing 35 are selected to minimize retro-reflection of laser beam 44 within the housing. Due to the high energy density of the laser beam, such retro-reflection or back focusing of the laser beam 44 would damage lenses 31, 33. Thus, by designing the lens objective 30 to minimize this retro-reflection or internal focusing of the laser beam within the housing, a lens objective 30 is provided which can safely be utilized with a high density laser beam.

The part 10 is mounted on a chuck 46 on stage 32. The part 10 is placed on the chuck and held down by a vacuum to accurately maintain registration of the part on the stage 32. The chuck 46 also provides an exhaust for removing cutting debris and a clear path for the laser beam.

Figure 6:
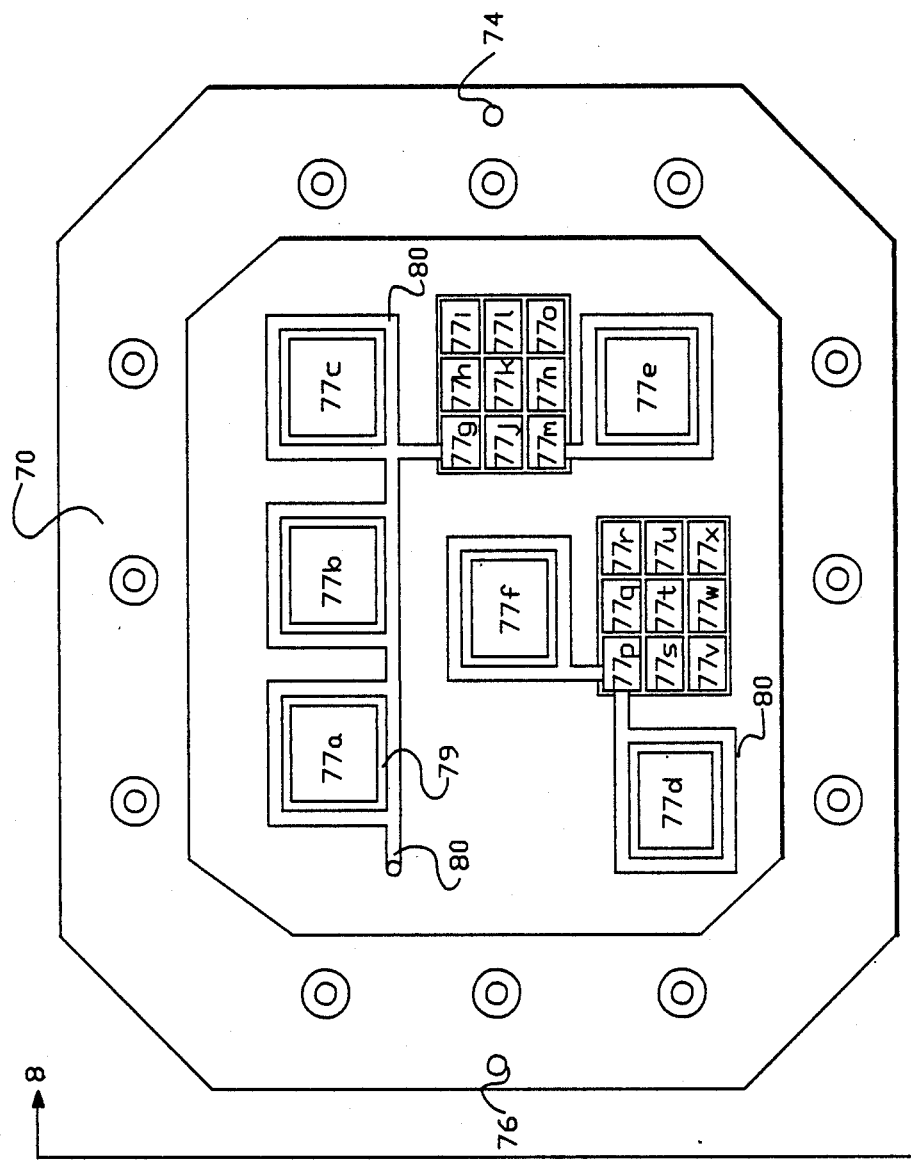
FIG. 6 schematically illustrates the top plate of the chuck.
Figure 8:
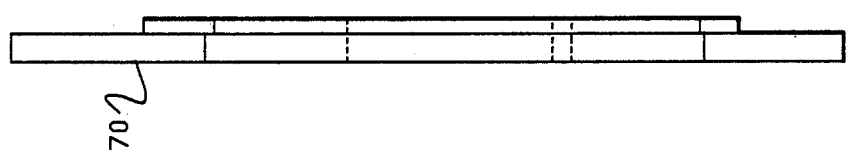
FIG. 8 is a schematic view along line 8—8 of FIG. 6.

The chuck 46 includes a top plate 70 (FIGS. 5,7) and a bottom plate 72 (FIGS. 6,8). The plates may be aluminum. The structure, i.e. part 10, from which material is to be removed is positioned on the top plate 70. The top plate 70 includes two alignment pins 74 and 76 for pre-alignment of the structure on the top plate. The rectangular areas or surfaces 77a–77x in top plate 70 correspond to, for example, the die site locations in the HDSC. The bottom plate 72 includes pedestals 78a–78x. The pedestal locations in bottom plate 72 correspond to the location of the rectangular areas in top plate 70. The size of the pedestals are slightly less than that of the corresponding rectangular areas in top plate 70. Thus, the pedestals 78a–78x are located beneath and in registration with the corresponding surfaces 77a–77x.

The HDSC or part 10, for example, is positioned on top plate 70 such that the die site areas in that structure are aligned with the rectangular areas 77a–77x. More specifically, each rectangular area has associated with it a rectangular channel, for instance channel 79a (FIG. 6), that corresponds to a clear polyimide band or channel that borders each die site in the HDSC.

During operation of the laser, material is removed from these bands to form the die sites.

The top plate 70 further includes a vacuum channel 80 connected to a vacuum source (not shown) via lines or conduits 82 and 84 (FIGS. 7 and 9) entering the chuck 46 through bottom plate 72. Part 10 is held in position on the top plate by the vacuum in channel 80.

Vacuum lines or conduits 86, 87, 88, and 89 also extend into the chuck through back plate 72. These lines provide a vacuum action to remove debris formed during the material removal operation, the debris falling into the space between the top and bottom plates.

An optical alignment microscope or video camera (not illustrated) may be employed for positioning the part on the top plate. This is done by viewing two alignment marks on opposite sides of part 10 through such optics and rotating the part into a proper position or by using the computer to remove the rotational error by x-and y-movement.

In a preferred embodiment, system 20 comprises a modified LMMC-4, XMR Laser Micromachining Center available from XMR, Inc., Santa Clara, Calif. The modifications include: the laser that operates at a wavelength of 248 nm; the down collimator optics with lenses having a focal distance of 250 mm and −75 mm; the aperture with a plurality of slits; the objective lens having a demagnification power of four and which minimizes back focusing of the laser beam; and the chuck.

In operation, part 10 is positioned in the z-axis direction at a predetermined height to provide the best image plane for the laser beam. As noted, by design, a clear polyimide band having a rectangular configuration has been provided about each die site on the HDSC. This band is about 300 microns wide and the total thickness of the HDSC (the power and signal cores without the baseplate) is about 450 microns. The coordinates for the centerline of the band are fed into computer 34 to be used as cutting coordinates. During the cutting operation, stage 32 is moveable in the x-and y-directions under the control of computer 34. As noted, the part 10 is located on chuck 46, which is on stage 32.

All the cutting parameters, such as laser energy, laser frequency, and table speed, are controlled and set by computer 34. In a typical operation, laser energy density of 3–4 milli-joules/cm$^2$ per pulse, a laser frequency of 250 Hz, and a table speed of 750 microns/second are utilized. The cutting speed is not set directly; rather, it is set as a function of the laser's firing rate and the percentage of overlapping pulses required to make the cut. This synchronized pulsing (table speed is synchronized with the laser's frequency) assures that there will not be any unexposed area along the cut, especially at fast cutting speeds. In order to overcome the ramp that is produced at the beginning and end of each line due to the ramp/up and ramp/down of the table, a set number of pulses is fired at the beginning of the line before the table travels and also at the end of the line when the table has reached its desired coordinates. The total process time for forming the necessary die sites in a HDSC is on the order of one-half to three-quarters of an hour, depending on the HDSC type, i.e., the number of die sites to be formed in the HDSC.

Prior to starting the cutting operation, in order to protect structure 10 from active cutting debris, it can be coated with a thin layer (about 1 micron) of a water soluble, organic polymer such as polyvinylalcohol (PVA). This coating may be applied by a spin coating process. After the structure is cut, this protective layer can be rinsed off with deionized (DI) water leaving its surface free of debris.

In summary, an apparatus and method for forming die sites in high density electrical connecting structures has been described. The method does not induce substantial thermal and/or mechanical stresses in the structure. This is achieved by utilizing an excimer laser as the energy source, and providing a processing system (optical and mechanical components) suitable for this application.

The present invention has been described in terms of a preferred embodiment. The invention, however, is not limited to the embodiment depicted and described. Rather, the scope of the invention is defined by the appended claims.

What is claimed is:

1. An apparatus for removing material from a structure, comprising:
    an excimer laser for removing the material by ablative photodecomposition;
    means for increasing the energy density of the laser beam;
    aperture means including a plurality of openings of different sizes and shapes;
    means for selectively positioning at least one of said openings in the laser beam; and
    a stage for supporting the structure, said stage capable of at least x-y travel.

2. The apparatus of claim 1 further including computer means to control movement of said stage and said aperture means, and the operation of said excimer laser.

3. The apparatus of claim 1 wherein said excimer laser operates at a wavelength of about 248 nanometers.

4. The apparatus of claim 1 wherein at least one of said openings has a L-shaped configuration.

5. The apparatus of claim 4 wherein said aperture means includes four openings having a L-shaped configuration.

6. The apparatus of claim 4 wherein said aperture means includes at least two openings having a horizontal orientation.

7. The apparatus of claim 4 wherein said aperture means includes at least two openings having a vertical orientation.

8. The apparatus of claim 4 wherein said aperture means includes at least one square opening.

9. The apparatus of claim 1 wherein said aperture means has a disk-like shape and said openings are equally-angularly disposed about the circumference of the disk at a given radius.

10. The apparatus of claim 1 further including a chuck for holding the structure on said stage by a vacuum and for exhausting debris produced by removing material from said structure.

11. The apparatus of claim 10 wherein said chuck comprises a top plate and a back plate, and said top plate includes rectangular areas formed therein that correspond to die sites to be formed in a multilayer, high density, electrical connecting structure.

12. The apparatus of claim 11 wherein said top plate has a channel formed therein for establishing a vacuum at said top plate to hold said structure thereon.

13. The apparatus of claim 11 wherein said back plate includes a plurality of pedestals formed thereon which correspond in location to the position of said rectangular areas in said top plate.

14. The apparatus of claim 13 wherein a space is formed between said top and back plates so that said debris may fall therein to be exhausted by a vacuum action.

15. The apparatus of claim 1 wherein said energy density increasing means comprises a down collimator for decreasing the size of the laser beam and an optical means for demagnifying the laser beam.

16. The apparatus of claim 15 wherein said down collimator includes a pair of lenses one of said lenses having a focal distance of about 250 millimeters and the other of said lenses having a focal distance of about −75 millimeters.

17. The apparatus of claim 15 wherein said optical means includes a pair lenses disposed in a housing and spaced from each other.

18. The apparatus of claim 17 wherein the thicknesses of said lenses are approximately equal and the radiuses of curvature of said lenses are selected to minimize retro-reflection of the laser beam within said optical means.

19. The apparatus of claim 15 wherein said optical means has a four power objective.

20. The apparatus of claim 1 or 15 wherein the energy density of the laser beam on the structure is between about 3 and 4 milli-joules per square centimeter per pulse.

21. An apparatus for removing material from a structure, comprising:
    an excimer laser for removing the material by ablative photodecomposition;
    means for increasing the energy density of the laser beam;
    disk-shaped aperture means including a plurality of openings of different sizes and shapes, said aperture means rotatable about an axis of rotation and said openings disposed about the circumference of said aperture means at a given radius from the axis of rotation;
    means for selectively positioning at least one of said openings in the laser beam; and
    a stage for supporting the structure, said stage capable of at least x-y travel.

22. A method for removing material from a structure, comprising:
    supporting the structure on a stage moveable in at least the x and y directions;
    providing an aperture means having a plurality of openings of different sizes and shapes; and
    actuating an excimer laser and directing a laser beam through at least a selected one of said openings to remove material from said structure by ablative photodecomposition.

23. A method for removing material from an electrical interconnection structure, comprising:
    actuating an excimer laser and directing a laser beam therefrom;
    selectively positioning at least one opening of a disk-shaped aperture in said laser beam, said aperture including a plurality of openings of different shapes and sizes;
    increasing the energy density of the laser beam so that it is between about 3 and 4 milli-joules per square centimeter per pulse on said structure; and
    directing said laser beam from said selected opening to said structure, said structure supported on a stage moveable in the x and y directions, and said material removed from said structure by ablative photodecomposition.

24. The method of claim 23 wherein said structure comprises an electrical interconnection structure including multiple layers each layer including conductors disposed in a polymer matrix.

25. The method of claim 24 wherein said laser is operated at a wavelength of about 248 nanometers.

26. The method of claim 24 or 25 wherein said material is ablated without damaging said structure.

27. The method of claim 23 further including positioning said structure on a chuck located on said stage.

28. The method of claim 27 further including maintaining said structure on said chuck by a vacuum.

29. The method of claim 27 further including exhausting by vacuum action debris produced when removing material from said structure.

30. The method of claim 23 wherein said stage is moved in the x and y directions during the actuation of said laser in order to remove material from said structure, and the movement of such stage is synchronized with the frequency of operation of said laser.

31. The method of claim 30 wherein prior to moving said stage said laser is operated for a predetermined period of time to remove material from said structure.

32. The method of claim 31 wherein after said stage has moved for a predetermined period of time and has come to a stop, said laser is actuated for a predetermined period of time to remove additional material from said structure.

33. The method of claim 23 wherein the energy density of said laser beam is increased by down collimating the beam and then demagnifying it.

34. The method of claim 33 wherein the beam is demagnified by a factor of four.

* * * * *